(12) United States Patent
Ren et al.

(10) Patent No.: US 11,578,959 B2
(45) Date of Patent: Feb. 14, 2023

(54) BULLET WITH NEGATIVE POISSON'S RATIO EFFECT AND METHOD OF DESIGNING THEREOF

(71) Applicant: NANJING TECH UNIVERSITY, Jiangsu (CN)

(72) Inventors: Xin Ren, Jiangsu (CN); Chuanzhen Han, Jiangsu (CN); Shilong Wang, Jiangsu (CN); Xiangyu Zhang, Jiangsu (CN)

(73) Assignee: NANJING TECH UNIVERSITY, Jiangsu (CN)

( * ) Notice: Subject to any disclaimer, the term of this patent is extended or adjusted under 35 U.S.C. 154(b) by 305 days.

(21) Appl. No.: 16/955,789

(22) PCT Filed: Jan. 10, 2019

(86) PCT No.: PCT/CN2019/071154
§ 371 (c)(1),
(2) Date: Jun. 19, 2020

(87) PCT Pub. No.: WO2020/124708
PCT Pub. Date: Jun. 25, 2020

(65) Prior Publication Data
US 2021/0231422 A1 Jul. 29, 2021

(30) Foreign Application Priority Data

Dec. 19, 2018 (CN) .......................... 201811559242.9

(51) Int. Cl.
*F42B 12/02* (2006.01)
*F42B 12/76* (2006.01)
(Continued)

(52) U.S. Cl.
CPC .............. *F42B 12/76* (2013.01); *F42B 12/04* (2013.01); *F42B 14/00* (2013.01); *F42B 33/00* (2013.01); *F42B 12/02* (2013.01); *G06F 30/17* (2020.01)

(58) Field of Classification Search
CPC .......... F42B 10/00; F42B 10/38; F42B 12/00; F42B 12/02; F42B 12/04; F42B 12/76;
(Continued)

(56) References Cited

U.S. PATENT DOCUMENTS

| 9,908,295 B2 * | 3/2018 | Ou ..................... G05B 19/4099 |
| 2011/0059291 A1 * | 3/2011 | Boyce ........................ C08J 5/18 |
| | | 428/218 |

FOREIGN PATENT DOCUMENTS

| CN | 201322582 | 10/2009 |
| CN | 203657628 | 6/2014 |

(Continued)

OTHER PUBLICATIONS

Written Opinion of International Searching Authority in PCT/CN2019/071154; dated Sep. 20, 2019 (Year: 2019 ).*
(Continued)

Primary Examiner — James S Bergin
(74) Attorney, Agent, or Firm — JCIPRNET

(57) ABSTRACT

The present invention discloses a bullet with a negative Poisson's ratio effect and a method of designing thereof. The bullet includes a cylindrical section of the bullet having a negative Poisson's ratio design, and a conical tail of the bullet and a tip of the bullet each with a matching design; the cylindrical section of the bullet is a tubular structure having periodically alternating transverse and vertical holes; the tubular structure includes a plurality of holes, with a center axis of one hole being axially perpendicular to a center axis of another adjacent hole, that is, the axis of each hole being
(Continued)

structurally orthogonal to an adjacent hole; and the holes in rows and columns are periodically arranged into the tubular structure, which is a tubular structure having the negative Poisson's ratio effect.

4 Claims, 2 Drawing Sheets

(51) Int. Cl.
    *F42B 14/00*     (2006.01)
    *F42B 33/00*     (2006.01)
    *F42B 12/04*     (2006.01)
    *G06F 30/17*     (2020.01)

(58) Field of Classification Search
    CPC .......... F42B 12/78; F42B 12/80; F42B 12/82; F42B 14/00; F42B 30/02; F42B 30/08; F42B 33/00; F42B 33/001
    USPC ....... 102/501, 503, 516, 517, 524; 86/54, 55
    See application file for complete search history.

(56) References Cited

FOREIGN PATENT DOCUMENTS

| | | | |
|---|---|---|---|
| CN | 108394135 | 8/2018 | |
| CN | 208187262 | 12/2018 | |
| CN | 209103290 | 7/2019 | |
| JP | H06137799 A | * 5/1994 | ............. F42B 12/82 |
| RU | 2122177 | 11/1998 | |

OTHER PUBLICATIONS

International Search Report in PCT/CN2019/071154; dated Sep. 20, 2019 (Year: 2019).*
"International Search Report (Form PCT/ISA/210) of PCT/CN2019/071154," dated Sep. 20, 2019, pp. 1-5.

* cited by examiner

BULLET WITH NEGATIVE POISSON'S RATIO EFFECT AND METHOD OF DESIGNING THEREOF

CROSS-REFERENCE TO RELATED APPLICATION

This application is a 371 of international application of PCT application serial no. PCT/CN2019/071154, filed on Jan. 10, 2019, which claims the priority benefit of China application no. 201811559242.9, filed on Dec. 19, 2018. The entirety of each of the above mentioned patent applications is hereby incorporated by reference herein and made a part of this specification.

TECHNICAL FIELD

The present invention relates to the technical field of negative Poisson's ratio effect designs, and in particular to a bullet with a negative Poisson's ratio effect and a method of designing thereof.

BACKGROUND OF THE INVENTION

Bullets can be said to be the product of civilization incorporating physics, chemistry, materials science, aerodynamics, and craftsmanship. Although their application involves killing, the bullets remain as the best choice for humans before the emergence of a new technology in which new project energy is used. How to improve the penetrability of the bullets and reduce the energy loss when a bullet discharging a chamber has been a hot topic of studies. Due to unique characteristics, negative Poisson's ratio materials and structures have been increasingly applied to different fields. A negative Poisson's ratio tubular structure has been manufactured and studied, which is a simple tubular structure exhibiting a negative Poisson's ratio behavior in compression and tension. The combination of a bullet with the tubular structure having the negative Poisson's ratio provides an idea for designing a novel bullet.

The negative Poisson's ratio materials have been developed for more than thirty years, with numerous results achieved. However, most of the existing literature is still based on the studies of two-dimensional negative Poisson's ratio materials. Three-dimensional (3D) negative Poisson's ratio materials are mostly porous structures having complex internal structures. Due to the backwardness of the manufacturing technology in the past, there are few three-dimensional negative Poisson's ratio materials that have been applied in practice. With the emergence of 3D printing technology, also named as additive manufacturing technology, this problem is solved well. The 3D printing technology is also considered as a symbol of the third industrial revolution. With this new technology, 3D negative Poisson's ratio materials and structures with complex shapes can be printed.

Base materials for designing and manufacturing the negative Poisson's ratio materials are mostly rubber, which are weak in bearing capacity and impact resistance. The mechanical properties of metallic metamaterials are generally stronger than those of elastomeric metamaterials. Combining a 3D metallic negative Poisson's ratio material having better mechanical properties with the advanced 3D printing technology to produce a negative Poisson's ratio product with practical application value has practical significance. Negative Poisson's ratio ammunition provides an idea for applying the metallic negative Poisson's ratio materials to the practice. The inventor envisaged a negative Poisson's ratio bullet according to the expansion and compression characteristics of the negative Poisson's ratio.

SUMMARY OF THE INVENTION

The object of the present invention is to address the shortcomings of the prior art to design and manufacture a practical negative Poisson's ratio bullet by combining structural optimization and 3D printing technology, and to propose a specific designing method, where a designed bullet has the characteristic of reducing energy loss due to frictions between the bullet and the gun barrel.

The present invention employs the following technical solution: a bullet with a negative Poisson's ratio effect, comprising: a cylindrical section of the bullet having a negative Poisson's ratio design, and a conical tail of the bullet and a tip of the bullet each with a matching design, wherein:

the cylindrical section of the bullet is a tubular structure having periodically alternating transverse and vertical holes;

the tubular structure comprises a plurality of holes, with a center axis of one hole being axially perpendicular to a center axis of another adjacent hole, wherein the holes are arranged in an array of rows and columns, with two mutually perpendicular holes between each alternating row and each alternating column, that is, the axis of each hole is structurally orthogonal to an adjacent hole, and the holes in the rows and columns are periodically arranged into the tubular structure, which is a tubular structure having the negative Poisson's ratio effect;

a relationship between a length M of the tip of the bullet and a diameter D of the bullet satisfies the following: $3.08>M/D>2.23$;

a relationship between a total length H of the bullet and the diameter D of the bullet satisfies the following: $5.4>H/D>3.28$;

a relationship between the diameter D of the bullet and a thickness N of a housing of the conical tail of the bullet satisfies the following: $3>D/N>1.5$; and a relationship between a length L of the cylindrical section of the bullet and a thickness T of a round tube of the cylindrical section of the bullet satisfies the following: $L/T>0.05$.

Preferably, the holes include elliptic, triangular and polygonal holes.

A method of designing the bullet with the negative Poisson's ratio effect includes the following steps:

1) determining shapes and sizes of individual components of the bullet according to the usage of the bullet, comprising the total length of the bullet, the length of the cylindrical section of the bullet, the length of the tip of the bullet, the length of the conical tail of the bullet and the diameter of the bullet;

2) designing the tubular structure of the cylindrical section of the bullet with periodically alternating transverse and vertical holes, matching a designed ideal negative Poisson's ratio tubular structure with other parts of the bullet, and based thereon, determining specific optimization to sizes and detailed components to establish a three-dimensional model; and 3) fabricating the bullet by using a 3D metal printing technology, and conducting actual experimental tests to verify whether the negative Poisson's ratio effect of the bullet meets ideal deformation requirements and actual use requirements. The bullet has the characteristic of reducing the energy loss due to frictions between the bullet and the gun barrel.

Advantageous effects The bullet designed with the method of the present invention has a larger negative Poisson's ratio effect, which reduces lateral expansion of the bullet passing through the gun barrel when being fired and improve the motion of the bullet, and has the characteristics of reducing the energy loss due to frictions between the bullet and the gun barrel. This allows the bullet to have a higher initial velocity and a stronger penetrating power, and greatly increases the service life of the gun barrel, thereby better meeting the actual needs.

DETAILED DESCRIPTION OF THE PREFERRED EMBODIMENTS

The present invention will be further described below in combination with particular embodiments and accompanying drawings.

Figure 1:
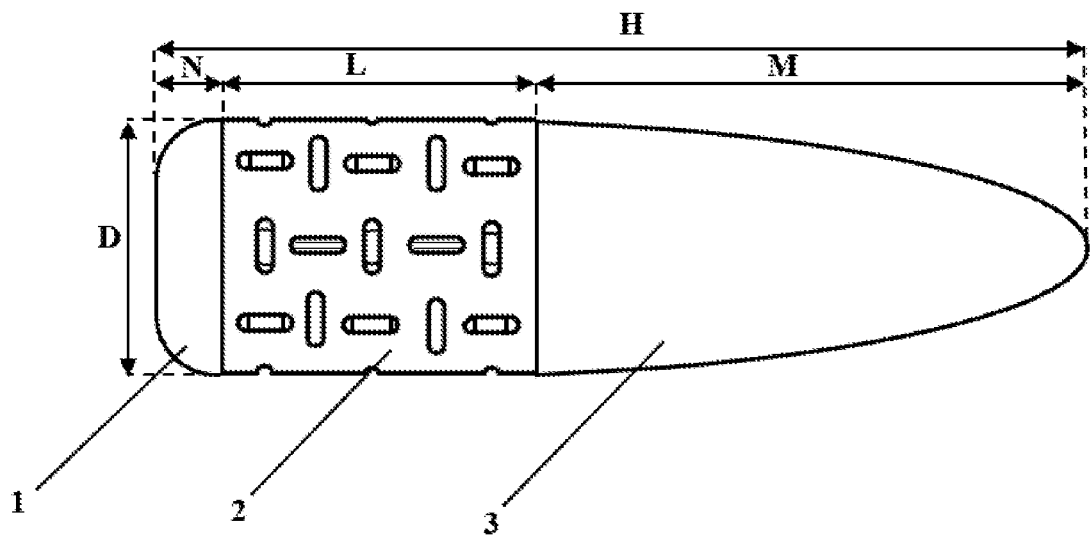
FIG. 1 is a schematic diagram of the structure of a bullet with a negative Poisson's ratio effect.
Figure 2:
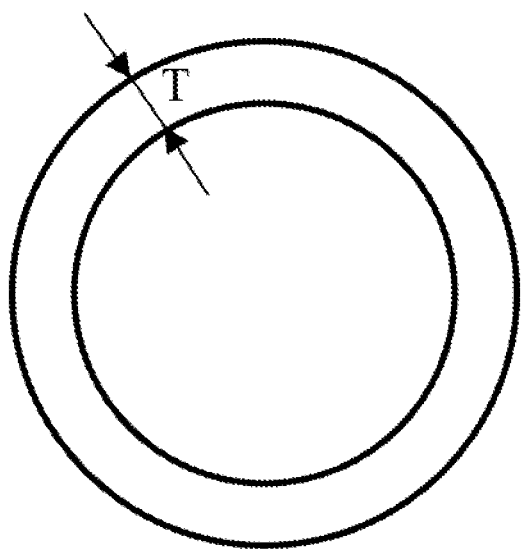
FIG. 2 is a cross-sectional view of FIG. 1.

As shown in FIGS. 1 and 2, a bullet with a negative Poisson's ratio effect includes: a cylindrical section of the bullet 2 having a negative Poisson's ratio design, and a conical tail of the bullet 1 and a tip of the bullet 3 each with a matching design.

The cylindrical section of the bullet 2 is a tubular structure having periodically alternating transverse and vertical holes.

The tubular structure includes a plurality of holes; a center axis of one hole is axially perpendicular to a center axis of another adjacent hole; the holes are arranged in an array of rows and columns, with two mutually perpendicular holes between each alternating row and each alternating column, that is, the axis of each hole is structurally orthogonal to an adjacent hole; and the holes in the rows and columns are periodically arranged into the tubular structure, which is a tubular structure having the negative Poisson's ratio effect;

A relationship between a length M of the tip of the bullet 3 and a diameter D of the bullet satisfies the following: $3.08 > M/D > 2.23$;

A relationship between a total length H of the bullet and the diameter D of the bullet satisfies the following: $5.4 > H/D > 3.28$;

A relationship between the diameter D of the bullet and a thickness N of a housing of the conical tail of the bullet 1 satisfies the following: $3 > D/N > 1.5$; and A relationship between a length L of the cylindrical section of the bullet 2 and a thickness T of a round tube of the cylindrical section of the bullet 2 satisfies the following: $L/T > 0.05$.

The holes include elliptic, triangular and polygonal holes.

A method of designing the above bullet with the negative Poisson's ratio effect includes the following steps in detail:

1. The shapes and sizes of individual components of the bullet are determined.

According to the usage, the sizes of the individual components of the bullet to be designed, such as the total length H of the bullet, the length L of the cylindrical section of the bullet, the length M of the tip of the bullet, the length N of the conical tail of the bullet and the thickness T of a tubular structure of the cylindrical section of the bullet, are determined, as shown in FIG. 1 and FIG. 2.

2. A tubular structure of the cylindrical section of the bullet having periodically alternating transverse and vertical holes is designed, with the holes including: (1) elliptic holes; (2) triangular holes; and (3) polygonal holes. The specific embodiment is illustrated as follows with the elliptic holes as an example here.

Figure 3A:
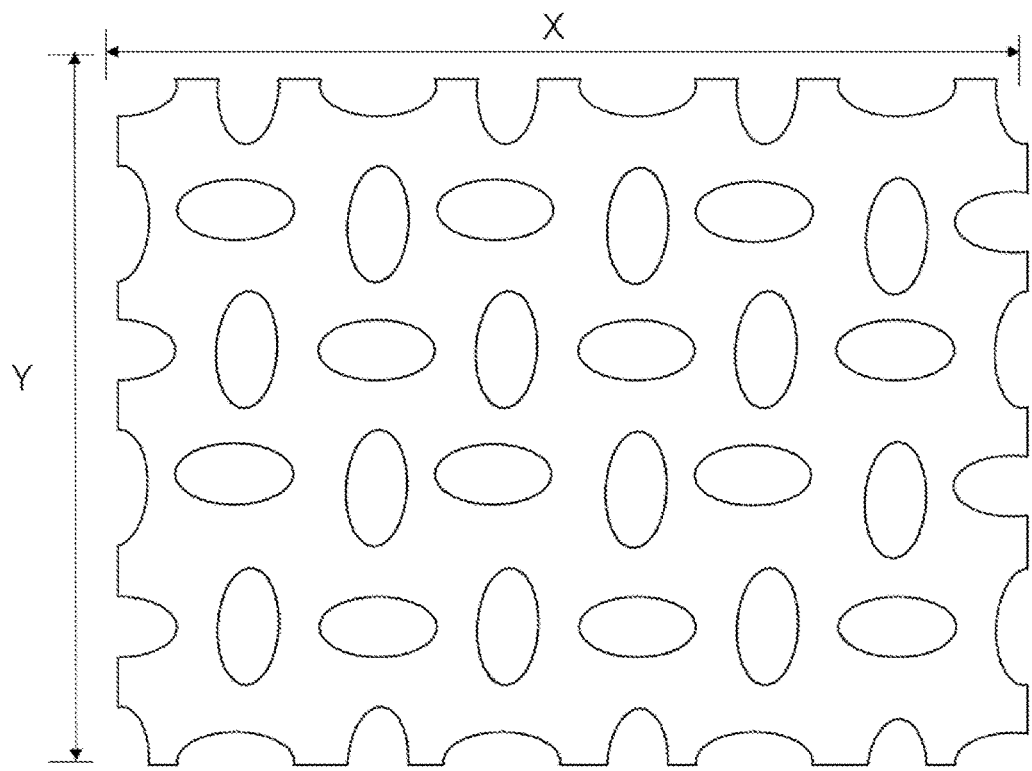
FIG. 3a is a plan view of a two-dimensional hole structure.
Figure 3B:
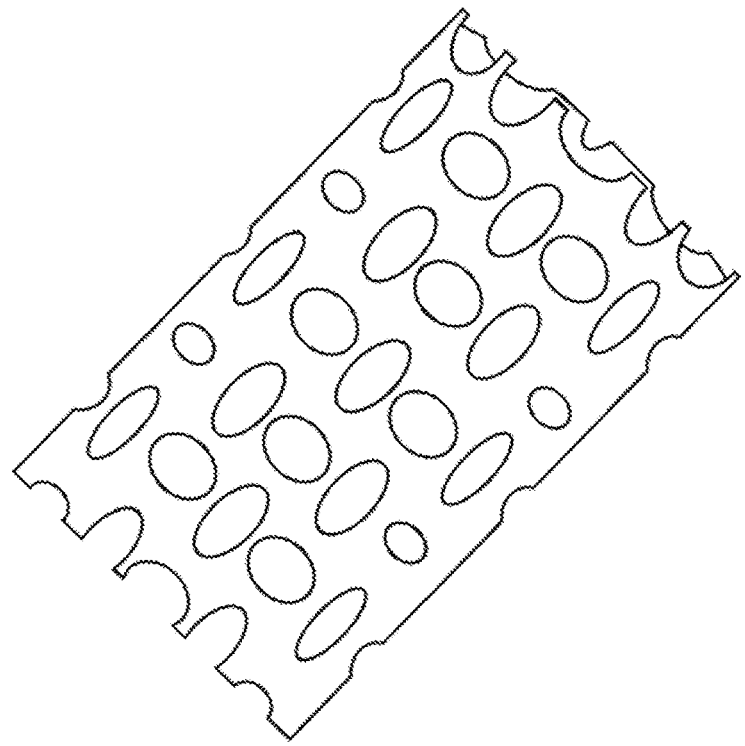
FIG. 3b shows a tubular structure after coordinate transformation.

First, a negative Poisson's ratio tubular structure was designed. FIG. 3a shows a negative Poisson's ratio tubular structure having a hole rated as 0.69. This negative Poisson's ratio tubular structure under planar constraints exhibits a negative Poisson's ratio behavior caused by elastic instability. A planar slice may be transformed into a tubular structure by using a coordinate transformation method, as shown in FIG. 3b. Notably, the bullet has a wall small in thickness, and thus may be deemed as having a thin wall.

Next, a buckling analysis was performed on an initial tubular structure of a linear elastic base material. The buckling analysis was performed under uniaxial compression to obtain an ideal buckling model. A relevant feature solver was used for a solving process. In this operation, the degrees of freedom of free rotation outside a plane on lower nodes of a finite element model were limited. The degrees of freedom of a bottom node were also limited along a compression direction. It should be noted that a node at the bottom is fixed so as to avoid rigid rotation. A shell element was used for the buckling analysis, and a feature calculator was used for a linear buckling analysis.

Finally, an ideal buckling model was identified, and related parameters were changed to form an ideal negative Poisson's ratio tubular structure. The selection of an ideal buckling mode was similar to previous studies on the negative Poisson's ratio planar structures. More specifically, an expected buckling model should include a geometry similar to an alternating ellipsoid model. An ideal buckling model, i.e., a tubular structure having periodically arranged holes, was selected, and a product sum and factor (PSF) method was used for quantifying the adjustment to the initial tubular structure by means of the ideal buckling mode. That is, the ideal negative Poison's ratio tubular structure may be obtained.

A designed ideal negative Poisson's ratio tubular structure was matched with other parts of the bullet, and based thereon, the specific optimization to the sizes and detailed components were determined to establish a three-dimensional model. It should be noted that, since the components of the bullet are small in size, the requirement of a 3D printer for minimum printable size should be noted and met when the specific sizes are designed.

3. The designed bullet with the negative Poisson's ratio effect is produced by using the 3D printing technology, and then a simple experiment is conducted to verify whether the bullet meets deformation and stress requirements.

It should be noted that those of ordinary skills in the art may also make various improvements and modifications without departing from the principle of the present invention, and these improvements and modifications shall be construed as falling within the protection scope of the present invention. Any components that are not identified in this embodiment can be implemented by the prior art.

What is claimed is:

1. A bullet, comprising:
a cylindrical section of the bullet having a negative Poisson's ratio, and a conical tail of the bullet and a tip of the bullet, wherein:
the cylindrical section of the bullet is a tubular structure having periodically alternating transverse and vertical holes;
wherein for each of the alternating transverse and vertical holes, a center axis of one of the alternating transverse and vertical holes is axially perpendicular to a center axis of another adjacent hole, the holes are arranged in an array of rows and columns, with two mutually perpendicular holes between each alternating row and each alternating column, that is, the axis of each hole is structurally orthogonal to an adjacent hole, and the holes in the rows and columns are periodically arranged into the tubular structure, which is a tubular structure having the negative Poisson's ratio;
a relationship between a length M of the tip of the bullet and a diameter D of the bullet satisfies the following: 3.08>M/D>2.23;
a relationship between a total length H of the bullet and the diameter D of the bullet satisfies the following: 5.4>H/D>3.28;
a relationship between the diameter D of the bullet and a thickness N of a housing of the conical tail of the bullet satisfies the following: 3>D/N>1.5; and
a relationship between a length L of the cylindrical section of the bullet and a thickness T of a round tube of the cylindrical section of the bullet satisfies the following: L/T>0.05.

2. The bullet according to claim 1, wherein the holes comprise elliptic, triangular and polygonal holes.

3. A method of fabricating the bullet according to claim 2, comprising the following steps:
1) determining shapes and sizes of individual components of the bullet according to the usage of the bullet, comprising: the total length of the bullet, the length of the cylindrical section of the bullet, the length of the tip of the bullet, the length of the conical tail of the bullet and the diameter of the bullet;
2) designing the tubular structure of the cylindrical section of the bullet with periodically alternating transverse and vertical holes, matching a designed negative Poisson's ratio tubular structure with the conical tail of the bullet and the tip of the bullet, and based thereon, determining sizes of the tubular structure of the cylindrical section of the bullet, the conical tail of the bullet, and the tip of the bullet to establish a three-dimensional model; and
3) fabricating the bullet by using a 3D metal printing technology, and conducting actual experimental tests to verify whether the bullet meets characteristics of reducing energy loss due to frictions between the bullet and a gun barrel.

4. A method of fabricating the bullet according to claim 1, comprising the following steps:
1) determining shapes and sizes of individual components of the bullet according to the usage of the bullet, comprising: the total length of the bullet, the length of the cylindrical section of the bullet, the length of the tip of the bullet, the length of the conical tail of the bullet and the diameter of the bullet;
2) designing the tubular structure of the cylindrical section of the bullet with periodically alternating transverse and vertical holes, matching a designed negative Poisson's ratio tubular structure with the conical tail of the bullet and the tip of the bullet, and based thereon, determining sizes of the tubular structure of the cylindrical section of the bullet, the conical tail of the bullet, and the tip of the bullet to establish a three-dimensional model; and
3) fabricating the bullet by using a 3D metal printing technology, and conducting actual experimental tests to verify whether the bullet meets characteristics of reducing energy loss due to frictions between the bullet and a gun barrel.

* * * * *